(12) United States Patent
Enquist

(10) Patent No.: US 6,740,909 B2
(45) Date of Patent: May 25, 2004

(54) SELF ALIGNED SYMMETRIC INTRINSIC PROCESS AND DEVICE

(75) Inventor: Paul Enquist, Cary, NC (US)

(73) Assignee: Ziptronix, Inc., Research Triangle Park, NC (US)

( * ) Notice: Subject to any disclaimer, the term of this patent is extended or adjusted under 35 U.S.C. 154(b) by 0 days.

(21) Appl. No.: 09/822,335

(22) Filed: Apr. 2, 2001

(65) Prior Publication Data

US 2001/0019873 A1 Sep. 6, 2001

Related U.S. Application Data

(62) Division of application No. 09/311,149, filed on May 13, 1999, now Pat. No. 6,242,794, which is a division of application No. 09/165,203, filed on Oct. 2, 1998, now Pat. No. 6,368,930.

(51) Int. Cl.$^7$ ................. H01L 31/0328; H01L 31/0336; H01L 31/072; H01L 31/109; H01L 27/082

(52) U.S. Cl. ................. 257/197; 257/198; 257/586; 257/587

(58) Field of Search ................. 257/197, 198, 257/586, 587

(56) References Cited

U.S. PATENT DOCUMENTS

| | | | |
|---|---|---|---|
| 4,751,201 A | | 6/1988 | Nottenburg et al. |
| 5,037,769 A | | 8/1991 | Inada et al. |
| 5,247,192 A | * | 9/1993 | Nii ................. 257/77 |
| 5,249,074 A | | 9/1993 | Topham |
| 5,311,047 A | * | 5/1994 | Chang |
| 5,318,916 A | | 6/1994 | Enquist et al. |
| 5,365,090 A | * | 11/1994 | Taka et al. ................. 257/197 |
| 5,378,901 A | * | 1/1995 | Nii ................. 257/77 |
| 5,387,807 A | | 2/1995 | Bayraktaroglu |
| 5,391,504 A | | 2/1995 | Hill et al. |
| 5,468,658 A | | 11/1995 | Bayraktaroglu |
| 5,512,496 A | | 4/1996 | Chau et al. |
| 5,552,617 A | | 9/1996 | Hill et al. |
| 5,557,117 A | * | 9/1996 | Matsuoka et al. ................. 257/184 |
| 5,598,015 A | * | 1/1997 | Tanoue et al. ................. 257/197 |
| 5,614,750 A | * | 3/1997 | Ellul et al. ................. 257/386 |
| 5,648,294 A | | 7/1997 | Bayraktaroglu |
| 5,684,308 A | | 11/1997 | Lovejoy et al. |
| 5,834,800 A | * | 11/1998 | Jalali-Farahani et al. ... 257/198 |
| 5,856,209 A | | 1/1999 | Imanishi |
| 5,861,640 A | * | 1/1999 | Gomi ................. 257/197 |
| 5,903,018 A | * | 5/1999 | Shimawaki ................. 257/198 |
| 5,907,165 A | * | 5/1999 | Hamm et al. ................. 257/197 |
| 5,943,577 A | | 8/1999 | Contrata et al. |
| 5,962,879 A | * | 10/1999 | Ryum et al. ................. 257/198 |
| 6,060,360 A | * | 5/2000 | Lin et al. ................. 438/264 |

* cited by examiner

*Primary Examiner*—Ngân V. Ngô
(74) *Attorney, Agent, or Firm*—Oblon, Spivak, McClelland, Maier & Neustadt, P.C.

(57) ABSTRACT

A semiconductor device and method of fabricating the device. An emitter region is formed self centered and self aligned symmetrically with a base region. Using frontside processing techniques, a collector is formed symmetrically self-aligned with the base region and the emitter region. The collector region may be further formed self-centered with the base region using backside processing techniques. The self-aligned and self-centered symmetric structure virtually eliminates parasitic elements in the device significantly improving the device performance. The device is scalable on the order of approximately 0.1 microns. The method also provides reproduceability and repeatability of device characteristics necessary for commercial manufacture of the symmetric device.

36 Claims, 9 Drawing Sheets

SELF ALIGNED SYMMETRIC INTRINSIC PROCESS AND DEVICE

This is a Division of Ser. No. 09/311,149 filed on May 13, 1999 now U.S. Pat. No. 6,242,794 which is a Division of Ser. No. 09/165,203 filed on Oct. 2, 1998 now U.S. Pat. No. 6,368,930.

BACKGROUND OF THE INVENTION

1. Field of the Invention

The present invention relates to a method for fabricating semiconductor devices and to a semiconductor device and, in particular, to a method of manufacturing heterojunction bipolar transistors having reproducible and repeatable device characteristics in a simplified manner while eliminating parasitic components.

2. Discussion of the Background

Heterojunction bipolar transistors are commonly manufactured having a vertical structure. Emitter, collector and base layers are deposited and emitter and collector mesas are formed from the respective layers. Alignment of the collector and emitter mesas is critical to device performance. Other manufacturing methods have attempted to produce vertical HBT devices with aligned emitter and collector regions. This a critical alignment and any manufacturing errors diminishes device performance. Further, these methods do not provide the necessary tolerance to produce a manufacturable HBT having reproducible and repeatable device characteristics necessary for a commercial device.

U.S. Pat. No. 5,318,916 describes a method of symmetric self aligned processing, the disclosure of which is herein incorporated by reference. Symmetric emitter and collector portions are formed using front and back side processing of a wafer. An emitter mesa is etched using an emitter contact or other feature as a mask on the front side of the wafer. The collector layer is formed using back side processing where the substrate is removed to expose the collector layer. A contact is formed on the collector layer symmetrically aligned with the emitter contact. This process is done photolithographically and may be misaligned due to manufacturing tolerances.

The collector layer is etched to produce the collector mesa. The alignment of the collector contact may be improved in the case of very thin layers with an infrared alignment tool. However, the alignment of the emitter and collector is still a critical alignment step and subject to manufacturing tolerances and misalignment. Any misalignment or offset due to the photolithographic or other processing steps will degrade the device characteristics and limit scaling of the device to a minimum feature size.

SUMMARY OF THE INVENTION

It is an object of the present invention is to provide a symmetric self-aligned manufacturing process and device having high reproducibility and repeatability.

Another object of the present invention to provide a method of manufacturing with high reproducibility and repeatability necessary for commercial manufacturing.

A further object of the present invention to provide a method whereby a symmetric intrinsic process can be realized to a scale of ~0.1 $\mu$m without requiring any critical alignment.

A still further object of the invention to form a collector in a heterojunction bipolar transistor on one side of a stack of epitaxial layers in a self-aligned and symmetric manner to an emitter on another side of a stack of epitaxial layers.

Still another object of the invention is to provide a device and a process to manufacture a device have a self-aligned and self-centered configuration.

These and other objects are achieved by a method of fabricating semiconductor device including steps of forming an emitter and a base region, and forming a collector region symmetrically self-aligned with the emitter region. The collector portion may be further formed to be self-centered with the base region. The emitter, base and collector regions may be formed from a plurality of layers which are etched to form a vertical structure where the emitter, base and collector regions have substantially the same width. The method may also include a step of etching the emitter region to form an emitter portion having a width less than a width of the emitter region and being self-centered with the base region or a step of etching the collector region to form a collector portion having a width less than a width of the collector region and being self-centered with the base region.

The method may also include processing the device from both the emitter side of the device and the collector side of the device. The emitter portion may be formed from the emitter side of the device and the collector portion may be formed from the collector side of the device. Further, the device may consist of a plurality of layers formed on the substrate. The emitter region may be formed using one of the layers using processing on a front side of the substrate, the collector region may be formed from one of the layers using processing on the front side of the substrate, and a contact to the collector region may be formed using processing from a back side of the substrate.

The method according to the invention may also include forming a removable material over the emitter layer and attaching a second substrate to the removable material. The substrate may be removed to expose the collector region.

The collector region may be etched to have a desired width less than a width of the base region and greater than a width of the emitter region.

The method may further include the steps of forming the emitter, base and collector regions on a first substrate, depositing a removable film over the regions, attaching a second substrate to the film and then removing the first substrate to expose the collector region. After removing the first substrate, the collector region may be etched to form a collector portion having a width less than a width of the base region and being self-centered with the base region. The collector may also be etched after removing the substrate to have a width less than a width of the base region and greater than a width of the emitter region.

In a second embodiment of the method according to the invention, an emitter mesa may be formed and a sidewall may be formed on the emitter mesa. The step of forming the sidewall may be repeated a desired number of times to form a thick sidewall on the emitter mesa, or a dummy emitter may be used to produce a sidewall of a desired thickness. The base region and the collector region may then be formed having substantially the same width using the thick sidewall as a mask. The emitter mesa is self-centered with the base region. The second embodiment may also include steps of forming the emitter, collector and base regions on a first substrate, depositing a removable film over the regions, attaching a second substrate to the film and removing the first substrate to expose the collector region.

The method according to the invention may also be used to form heterojunction bipolar transistor emitter, base and collector regions. The emitter region is symmetrically self-aligned to the collector region, the emitter region is self-centered to the base region and the collector region is self-centered to the base region.

The method according to the invention may also be used to form a semiconductor device from a plurality of stacked layers. A first active region may be formed from one of the layers, and a second active region separated from the first active region by a third active layer may be formed. The first and second active regions are formed to be symmetrically self-aligned with respect to each other and self-centered with respect to the third active region. Such devices may be static induction transistors or vertical heterojunction FETs.

In another use of the method according to the invention, a plurality of layers may be formed on a substrate including a collector layer, a base layer and an emitter layer. The method may include a step of symmetrically self-aligning the collector layer, base layer and a emitter layer using processing from only one side of the substrate. An emitter region may be formed from the emitter layer self-centered with respect to the base layer, and a collector region may be formed in a collector layer self-centered with respect to the base region. The collector region may be formed using processing from a front side of substrate and a contact to the collector region may be formed using processing from a back side of the substrate. Symmetrically self-aligning the collector, base layer and emitter layer may be performed using processing on a front side of the substrate. An narrower emitter portion may be formed in the emitter layer self-centered with respect to the base region using processing on the front side of the substrate, and a narrower collector portion may be formed in the collector layer self-centered with respect to the base region using processing from a back side of the substrate.

The above and other objects may also be achieved by a semiconductor device having a base, an emitter and a collector. The collector is symmetrically self-aligned with the emitter. The collector and the emitter may be further self-centered with the base. The emitter may have a narrow portion self-centered with the base and the collector portion may also have a narrow portion self-centered with the base and symmetric with the emitter portion. The base layer may have a lower ledge and an upper ledge. A first base contact may be formed on the upper ledge self-aligned with the emitter and a second base contact may be formed on the lower ledge self-aligned with the collector. The collector may have a width less than a width of the base and greater than a width of the emitter. Further, the device may be a heterojunction bipolar transistor.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 5:
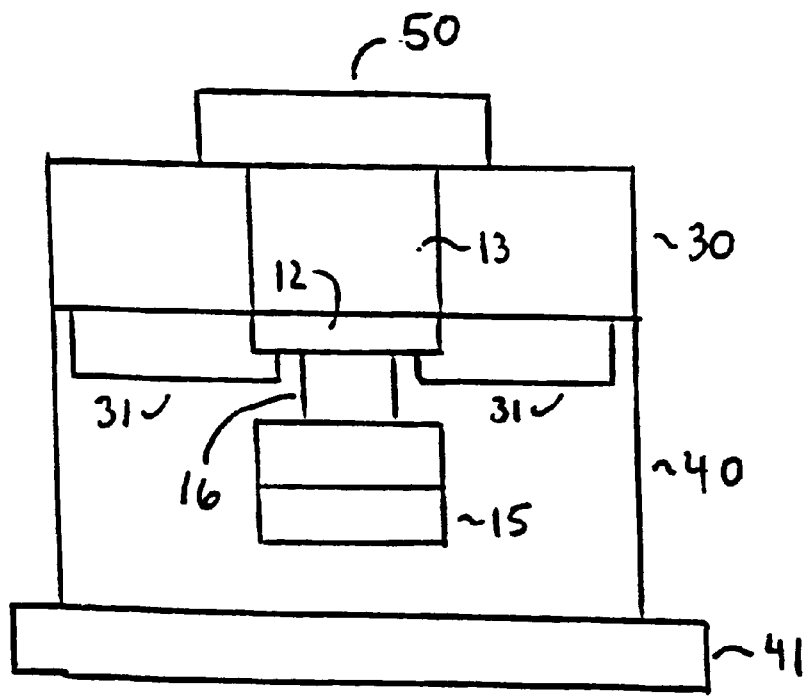
FIG. 5 is a sectional view illustrating steps in the process of manufacturing an HBT in the first embodiment of the method according to the invention.

Referring now to the drawings, wherein like reference numerals designate identical corresponding parts throughout the several views, and more particularly to FIG. 5, there is shown a sectional view illustrating a heterojunction bipolar transistor (HBT) according to a first embodiment of the device according to the invention. It should be pointed out that the drawings are schematic representations of the method and device according to the invention and are not meant to show actual relative device dimensions, layer thickness, etc. The drawings are only meant to illustrate the invention to allow one of ordinary skill in the art to understand how to make and use the same. The drawings show a device and the steps to form a single device, but it is understood that several devices could be manufactured at the same time interconnected in a desired fashion.

The HBT device includes an emitter 11, a base 12 and collector 13. The emitter contains a portion 16 formed by undercutting. Formed on the emitter is emitter contact 15 and formed over the collector is collector contact 50. Base contacts 31 are formed to base region 12. Reference numerals 30 and 40 represent planarizing material which is removable, and reference numeral 41 represents a surrogate substrate used in manufacturing the device. The emitter 11 and collector 13 are symmetric and self-aligned, and the emitter portion 16 is self-centered and self-aligned to both the emitter 11 and collector 13. The structure greatly reduces parasitic components of the device which reduce or limit performance.

Typically, substrate 14 is a GaAs material, collector layer 13 is a GaAs layer of approximately 1000–10,000 Å in thickness, base layer 12 is an 100–1000 Å thick GaAs layer and emitter layer 11 is a composite 500–5000 Å thick AlGaAs/GaAs layer. Other thicknesses and materials are possible. For instance, substrate 14 may be a InP material, collector layer 13 may be an AlInAs, GaInAs and/or InP material, base layer 12 may be GaInAs and emitter layer 11 may be a composite AlInAs, GaInAs and InP layer. GaN-based and Si-based materials may also be used. While not illustrated, etch stop layers may be disposed between collector 13 and substrate 14, and between base layer 12 and emitter layer 11.

Figure 7:
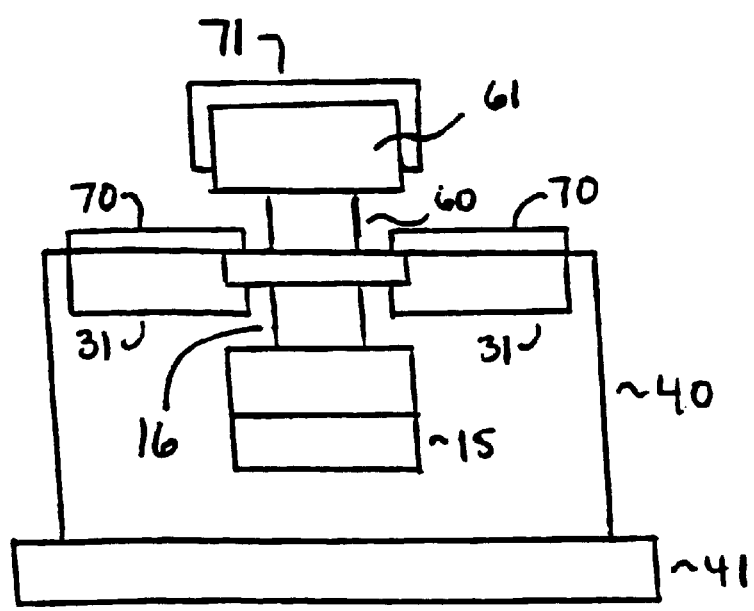
FIG. 7 is a sectional view illustrating steps in the process of manufacturing an HBT in the second embodiment of the method according to the invention.

In a second embodiment of the device, shown in FIG. 7, the collector mesa has a more narrow portion 60, also formed by undercutting, which is symmetric, self-aligned and self-centered to the base 12 and collector 61. Portion 60 is also self-aligned and self-centered to base layer 12, and may be symmetric to emitter portion 16. Portion 60 may be formed by undercutting. Emitter 11 and collector 13 are also self-aligned, as in the case of the first embodiment. Also shown are backside base contacts 70. The structure further reduces parasitic components of the device which reduce or limit performance compared to the device according to the first embodiment.

Figure 1:
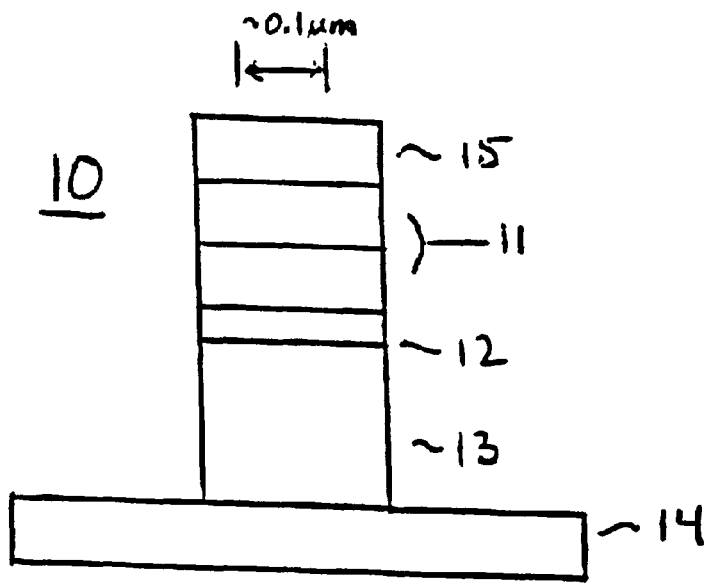
FIG. 1 is a sectional view illustrating steps in the process of manufacturing an HBT in a first embodiment of the method according to the invention.

A first embodiment of the method of manufacturing an HBT according to the invention will now be described. FIG. 1 illustrates an HBT structure 10 having an emitter layer 11, a base layer 12, and a collector layer 13 formed on top of a substrate 14. Emitter layer 11 is shown as having two layers, but may have more than two layers, as discussed above. Molecular beam epitaxy (MBE) and/or metal-organic chemical vapor deposition (MOCVD) may be used to form the layers. An emitter contact 15 is formed on the emitter layer using standard lithography techniques. Contact 15 is typically formed of metal such as Ti/Pt/Au to a thickness of approximately 2000 Å. The dimensions of the device are scalable to ~0.1 $\mu$m. FIG. 1 illustrates for reference typical device dimensions with a length of 0.1 $\mu$m shown for scale purposes only. The invention is not limited to particular device dimensions but can be applicable to a wide range of possible device materials and dimensions. The width of the emitter contact shown in FIG. 1 is scalable to 0.2–0.3 $\mu$m.

Figure 2:
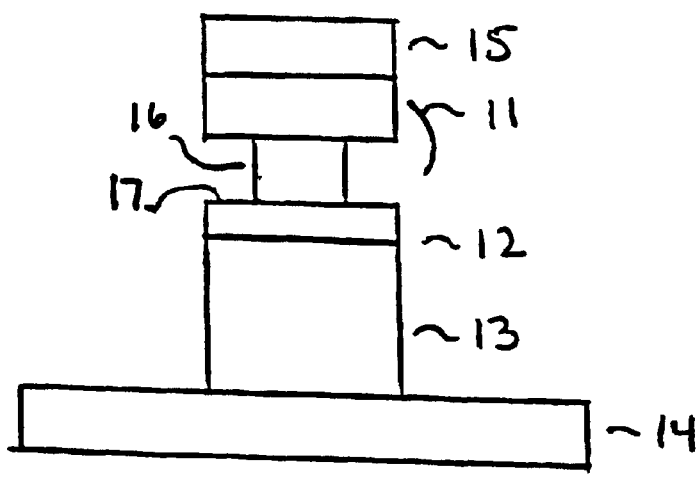
FIG. 2 is a sectional view illustrating steps in the process of manufacturing an HBT in the first embodiment of the method according to the invention.

The emitter contact 15 is used as a mask to etch the layers to provide structure 10. The etching is preferably continued through the collector layer or down to substrate 14. An anisotropic dry etching process is preferably used. While FIG. 2 shows essentially vertical sidewalls with no undercutting of the base, if the materials in the HBT or the etching chemistry, or both are properly chosen, a top base ledge can be formed on top of the base layer due to a higher etch rate of the emitter material on top of the base. This can be done in a separate step.

The undercut leaves an emitter portion 16 having a width of approximately 0.1 $\mu$m. The undercutting shown in FIG. 2 results from using etches selective to particular materials in a composite emitter layer. One or more of the layers of the emitter is preferentially etched while leaving remaining layers. The undercutting also forms base layer ledges 17 having a length of approximately 0.1 $\mu$m.

Figure 3:
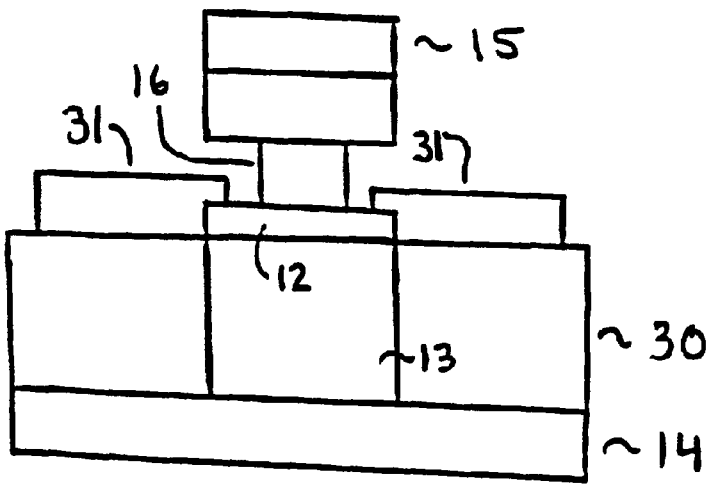
FIG. 3 is a sectional view illustrating steps in the process of manufacturing an HBT in the first embodiment of the method according to the invention.

A removable fill material 30 is applied to the device and planarized up to a level of the base, as shown in FIG. 3. Examples of fill material 30 are a polyimide film, SiO, or spin-on glass. Metal 31 is deposited on the base, preferably by a process that allows control over the proximity of the metalization to the emitter edge. Angled evaporation is one example. The metalization is performed around the periphery of the device by rotation around an axis at an angle to a longitudinal axis of the device. The proximity of the base metal 31 to emitter portion 16 is determined by the emitter thickness, the amount of undercut of the emitter relative to the emitter contact and base, and the angle of evaporation.

Figure 4:
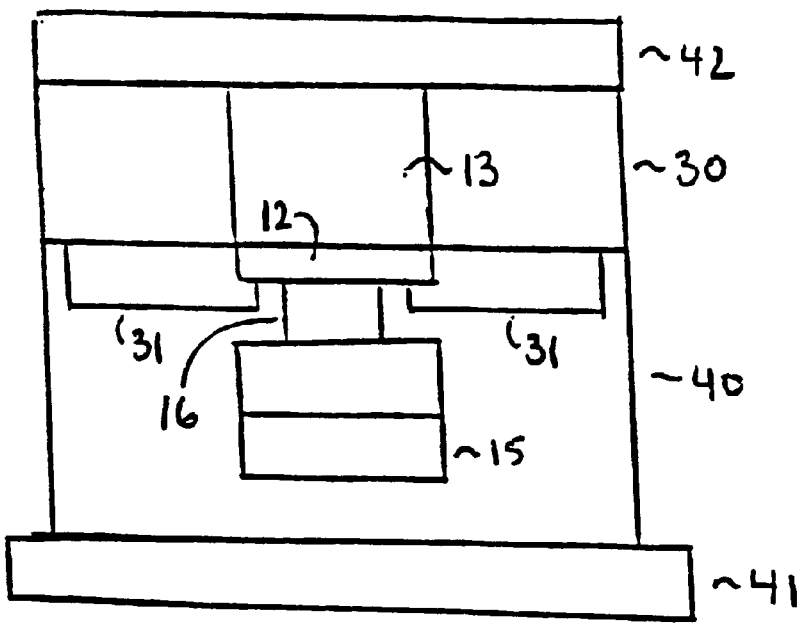
FIG. 4 is a sectional view illustrating steps in the process of manufacturing an HBT in the first embodiment of the method according to the invention.

More removable fill material 40 is deposited over the device and planarized. The device is then attached to a surrogate substrate 41 by a known method, and flipped, as shown in FIG. 4. The surrogate substrate 41 may be made of diamond, SiC, BeO or other materials. Known attachment methods include deposition and bonding methods. Deposition methods include plasma evaporation and plating, and bonding methods include epoxy, eutectic metal, fusion and direct. The backside processing of the device now takes place. Substrate 14 is lapped and polished to leave a portion 42. The collector material is exposed by a further selective etching process (or processes) that remove the substrate material but have low etch rates of the fill material 41 and the collector material, and/or by a method such as chemo-mechanical polishing (CMP). This resulting structure is illustrated by FIG. 5.

Metal is deposited and etched to form a collector contact 50 using lithographic techniques. The device has a self-aligned and self-centered emitter region and a self-aligned collector region. The device is capable of scaling to submicron dimensions, in particular ~0.1 $\mu$m.

Figure 6:
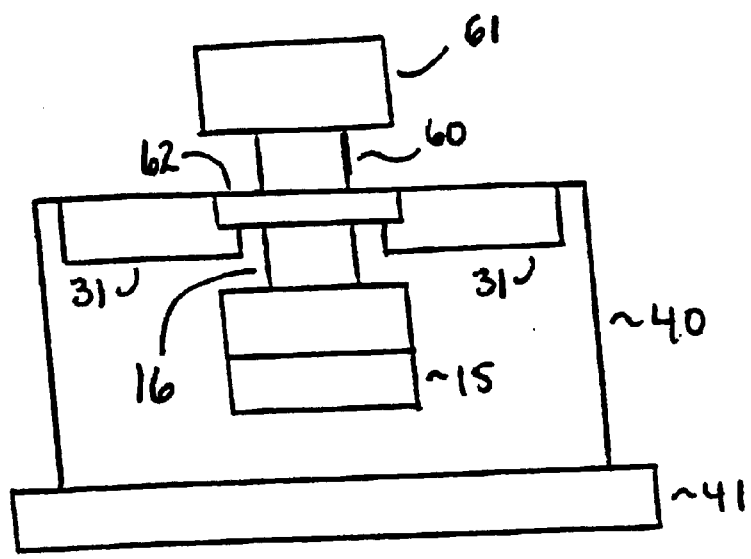
FIG. 6 is a sectional view illustrating steps in the process of manufacturing an HBT in a second embodiment of the method according to the invention.

In a second embodiment of the method according to the invention, the backside processing of the device shown in FIG. 5 is modified. Prior to the collector contact formation step, the fill material 30 is etched to expose the collector mesa 13, as shown in FIG. 6. Here, collector 13 may be formed of two or more layers, such as 60 and 61 having different etching characteristics so that selective etching and undercutting may be performed. One or more of the layers of the collector is preferentially etched while leaving remaining layers. The etching is continued to expose the base material 12 and to form base ledges 62 on the back side of base 12, expose base metalization 31, and to undercut the collector mesa to reduce the width of collector layer 60. Using another angled metalization technique, a backside base contact 70 is formed over the front side base metalization 31 and the exposed base material. These steps are illustrated in FIG. 7. As in the case of the emitter contact formation, the metalization is performed around the periphery of the device by rotation around an axis at an angle to a longitudinal axis of the device. The proximity of the backside base metal 70 to the collector portion 60 is determined by the thickness of collector 13, the amount of undercut of collector 13 relative to the collector contact and base, and the angle of evaporation.

A collector contact 71 is also formed using a metalization process. If the backside base metal contact 70 and collector contact metalizations are compatible, they can be formed in the same step. The device has a self-aligned and self-centered emitter region and a self-aligned collector region. Again, the device is capable of scaling to submicron dimensions, in particular ~0.1 $\mu$m.

Frontside processing may also be used to undercut the base to form both ledges 17 and ledges 62. The materials of the device and/or the etching chemistry may be selected to etch a layer or layers of both the emitter and the collector when forming the device stack. Both emitter portion 16 and narrowed collector layer 60 result. Also, the etching may consist of an etch sequence where a first anisotropic etch is performed to expose base 12, base 12 is undercut by a selected amount to form ledges 17 using a selective etch process, anisotropic etching is continued to expose the collector, and base layer 12 is undercut on the collector side to form ledges 62 using a selective etch. This sequence may be modified to slightly undercut the base on the emitter side, then performing an etch to undercut the base on both sides to complete the formation of ledges 17 and form ledges 62. The etch sequences are advantageous in forming a collector wider than the emitter.

The processing of the device continues as shown in FIG. 3 by depositing removable fill material 30 and forming contacts 31 to base ledges 17. A surrogate substrate is attached and substrate 14 is removed, as described above for the first embodiment. The removing of fill material 30 exposes bottom base ledges 62 and contacts are formed on ledges 62 and collector layer 61, as described above for the second embodiments.

Figure 15:
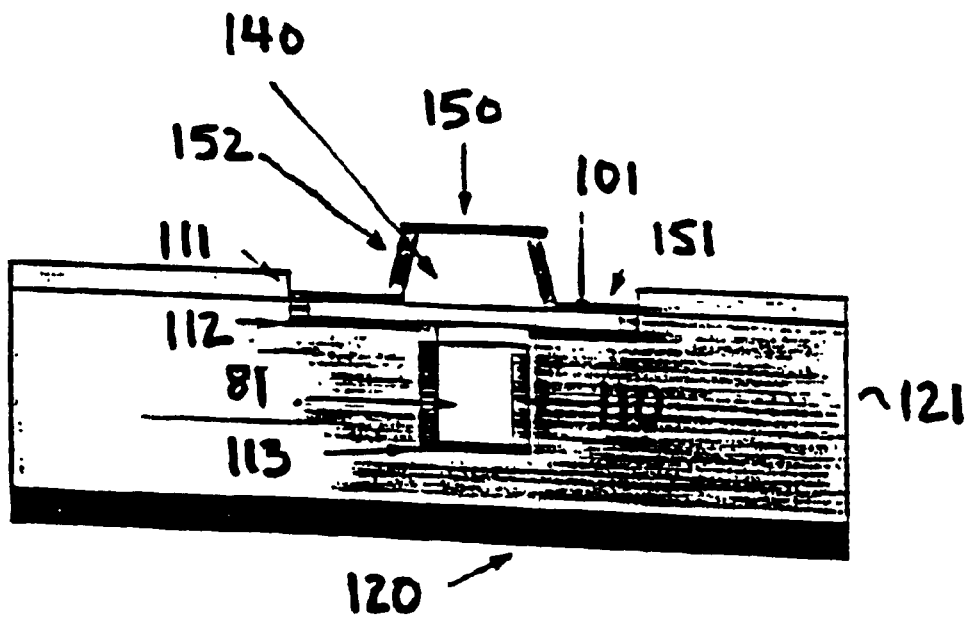
FIG. 15 is a sectional view illustrating a metalization step according to the fourth embodiment of the method according to the invention.

A third embodiment of the device according to the invention is shown in FIG. 15. The device includes emitter mesa 81 and collector region 140, both formed to be self-centered with respect to base region 101. Collector region 140 has a width less than that of base region 101 and greater than that of emitter mesa 81. Contact 150 is formed on collector 140, contact 113 is formed on emitter mesa 81, and contacts 112 and 151 are formed on base mesa 101. Also shown are insulating sidewalls 110, 111 and 152 used in the process of fabricating the device.

Figure 8:
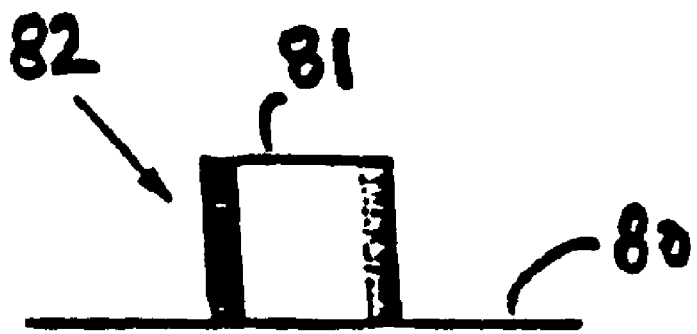
FIG. 8 is a sectional view illustrating steps in the process of manufacturing an HBT in a third embodiment of the method according to the invention.

A third embodiment of the method according to the invention will be described with reference to FIGS. 8–15. FIG. 8 shows an emitter mesa 81 formed on base material 80. The emitter mesa may be formed using a removable dielectric or the contact metalization as an etch mask. On either side of emitter mesa 81 are formed sidewalls 82. Sidewalls 82 are formed of a dielectric material by well known techniques. Briefly, the sidewalls are formed by conformal deposition of a dielectric material of a given thickness (typically 0.2 microns) followed by an anisotropic etch, preferably a dry etch, of normally the same thickness. FIG. 8 shows sidewalls 82 having vertical walls and square corners. However, in practice the upper portion of the sidewall 82 is somewhat rounded.

Figure 9:
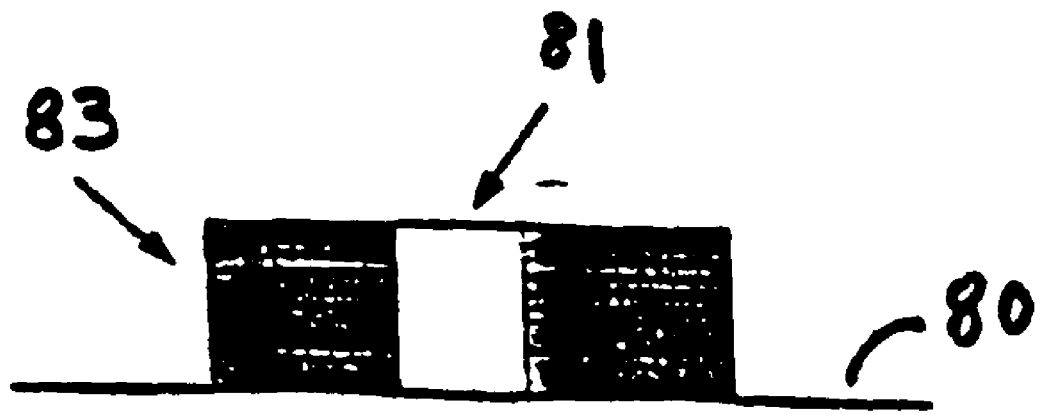
FIG. 9 is a sectional view illustrating a sidewall formation process in the third embodiment of the method according to the invention.

As shown in FIG. 9, the sidewall deposition step may be repeated a number of times to produce thicker sidewall film 83. The sidewall is repeated N times to form a thick sidewall and ledge underneath the sidewall of a width N times the thickness of the deposited film. The width of sidewall 83 is chosen to be sufficient for a particular application. For example, when it is desired for a HBT to have a width comparable to a base transfer length, which is defined as the square root of the ratio between the base contact resistivity in the base resistance. For base contact resistance of $10^{-6}$ ohm-cm$^2$ and a base sheet resistance of 100 ohms/square, this yields a transfer length of 1 micron. In this case, N is approximately 5 where the nominal dielectric sidewall thickness is 0.2 microns.

The thicker sidewall 83 for self-centering of the emitter mesa may also be formed by increasing the height of the emitter mesa since the thickness of a single sidewall iteration can be increased as the emitter mesa height is increased. This can be accomplished by increasing the thickness of epitaxial layers or, alternatively, with forming a dummy emitter on top of the epitaxial layers. A dummy emitter may be formed by first depositing a thick (~0.5 to 2.0 micron) dielectric layer on the emitter and then forming the emitter mesa by patterning and then vertically etching the thick dielectric layer and then etching the emitter mesa using the thick dielectric layer as an etch mask. This thicker height of the emitter mesa plus dielectric compared to emitter mesa allows a thicker sidewall to be used and reduce the number of iterations required to achieve a sidewall of a given desired thickness.

The thick sidewall process according to the invention is advantageous when applied to a self centered self aligned and symmetric device where the emitter mesa width is to be substantially smaller than the base mesa width, for example, where the emitter mesa width is approximately ⅓ or less than the width of the base mesa.

Figure 10:
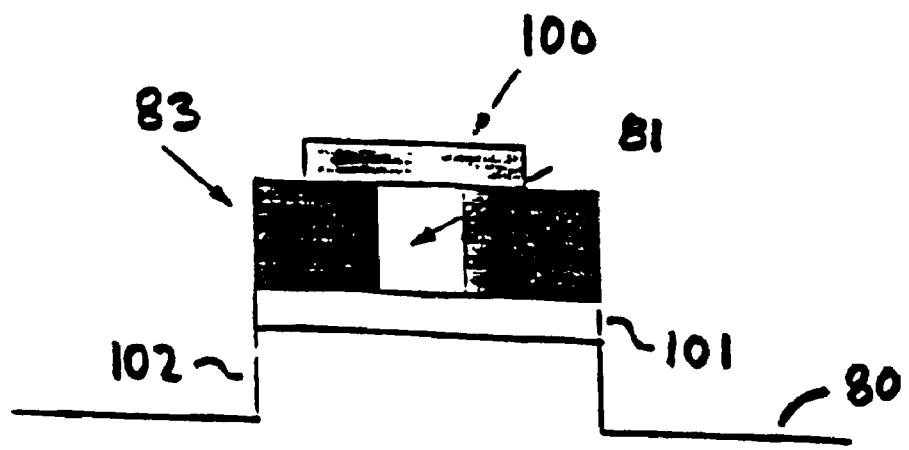
FIG. 10 is a sectional view illustrating a mesa formation process in the third embodiment of the method according to the invention.

A masking material is formed over the emitter mesa and the thick sidewall to protect the emitter mesa from subsequent etching processes. As shown in FIG. 10, material 100 is formed over emitter mesa 81 and sidewall 83. Following the masking step an anisotropic etching step is performed to leave base region 101. FIG. 10 also illustrates collector 102 exposed during the base region etching step. The etching is preferably continued through the collector region.

Figure 11:
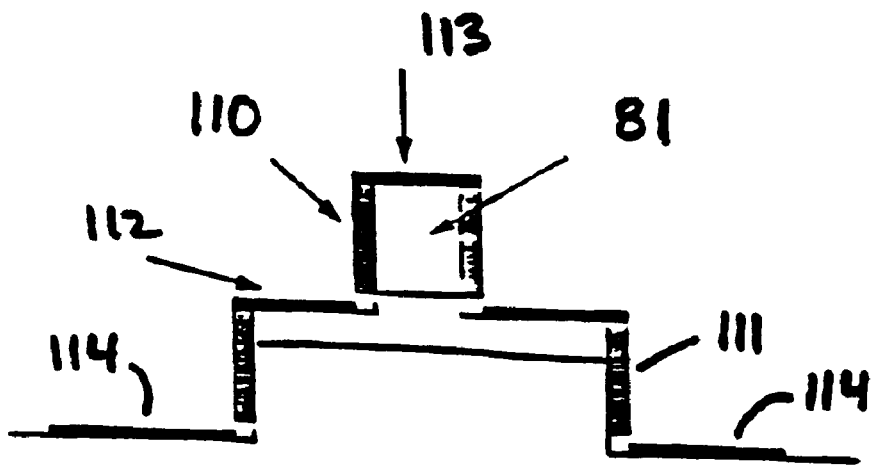
FIG. 11 is a sectional view illustrating steps in the process of manufacturing an HBT in the third embodiment of the method according to the invention.

Following removal of the masking material 100 and thick sidewall 83, sidewalls are formed on the emitter mesa 81 and base region 101. This is illustrated in FIG. 11 as sidewalls 110 on the emitter mesa 81 and sidewalls 111 on base mesa 101. The sidewalls may be formed using the same process described above to form sidewalls 82.

Following the formation of sidewalls 110 and 111, the base and emitter metalizations are formed. These are shown as 112 and 113, respectively in FIG. 11. FIG. 11 also illustrates excess metalization 114 formed on base material 80. This metal will not contact the device and may be subsequently removed if desired.

Alternatively to sidewall formation to maintain emitter and base contact isolation, and, for example, if the emitter contact is used to form the emitter mesa, the emitter contact may be undercut such that subsequent base contact formation with an anisotropic method such as e-beam evaporation will not compromise emitter and base contact isolation.

A brief etching step may also be performed prior to the emitter and base metalization to remove any damage to the base metalization region caused during the emitter mesa etch and to facilitate an undercut of the sidewall to avoid leakage current between the emitter and base. At this point the processing steps could proceed in the manner following FIG. 3 described above for the first embodiment according to the method. The modified structure formed by the processing steps described in connection with FIGS. 6 and 7 may also be performed at this point.

Figure 12:
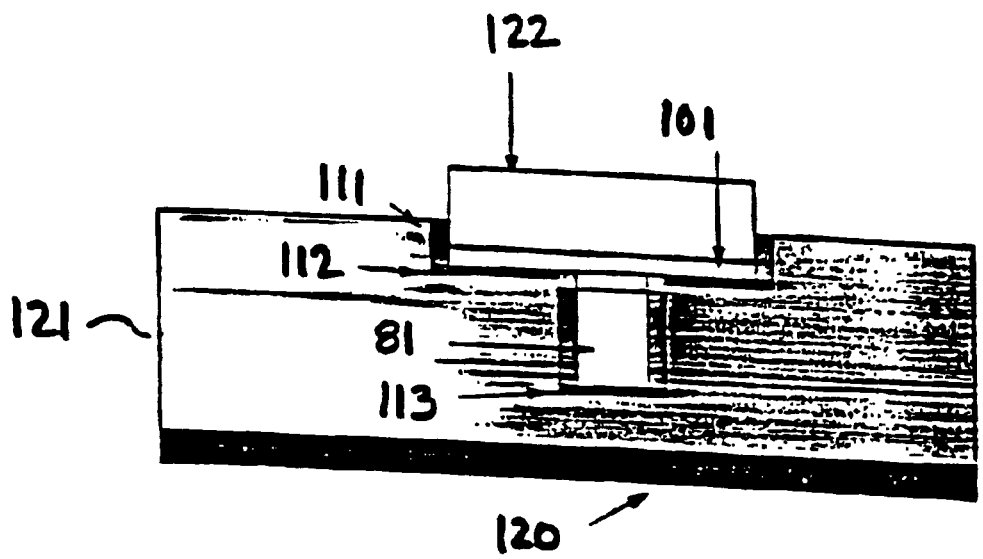
FIG. 12 is a sectional view illustrating steps in the process of manufacturing an HBT in a fourth embodiment of the method according to of the invention.

The processing of the structure shown in FIG. 11 may also proceed in a fourth embodiment of the method according to the invention. A removable film material as described above is deposited over the structure of FIG. 11 and planarized. A surrogate substrate is then attached to the removable film material and the device is flipped for backside processing. FIG. 12 illustrates the deposited film material 121 attached to the surrogate substrate 120. FIG. 12 also illustrates the device after the substrate removal process which is carried out as discussed above in connection with FIGS. 4 and 5 in the first embodiment of the method according to the invention. The film material 121 and the sidewalls 111 are etched to expose a portion of the collector mesa 122. This step is performed by selective etching process.

Figure 13:
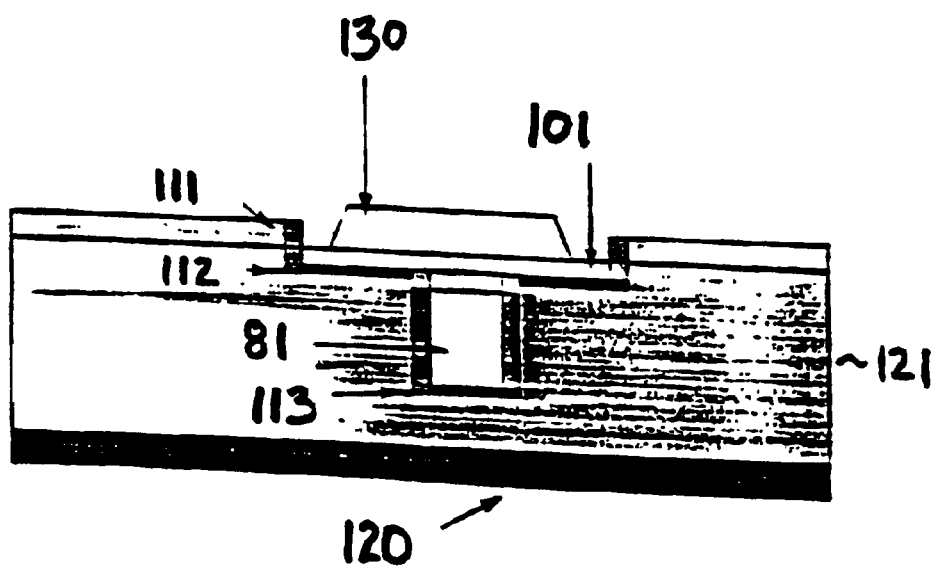
FIG. 13 is a sectional view illustrating a collector mesa formation step in the fourth embodiment of the method according to the invention.
Figure 14:
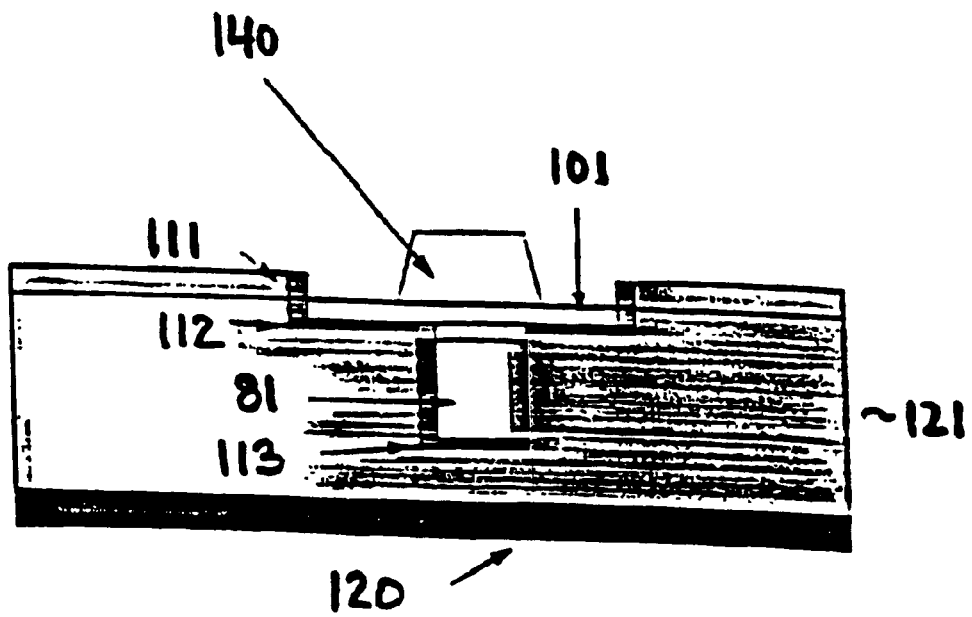
FIG. 14 is a sectional view illustrating steps used in forming the collector mesa according to the fourth embodiment of the method according to the invention.

FIG. 13 illustrates an etching step performed on collector mesa 122. This etching step is an isotropic backside etch to reduce the collector mesa both in width or width and thickness. This step may be performed using a wet etching step with or without etch stop layers. This step produces a collector mesa which is self-centered on the base mesa and symmetrically self-aligned to the emitter mesa 81 on the opposite side of the base layer. The etching step is preferably selective against etching the base layer. The backside etching can be extended to result in a more narrow collector mesa 140, as shown in FIG. 14. With proper selection of the exposed collector portion revealed from the backside, a desired collector mesa width between that of the width of the base region 101 and the emitter mesa 81 maybe realized. The arbitrary-width collector is again self-centered on base region 101 and self-aligned symmetrically to emitter mesa 81. The sidewalls of the collector mesas 130 and 140 are shown less than vertical since a wet etch was used.

FIG. 15 illustrates further sidewall deposition step to produce sidewalls 152 on the collector mesa. The sidewall formation step is followed by a metalization to form collector contact 150 and backside base contacts 151. Due to the possible non-vertical angle of the collector mesa sidewall, metalization may result on the sidewall which can compromise electrical isolation between backside base contact 151 and collector contact 150. Since the sidewall metalization is thinner than that forming base contact 151 and collector contact 150, it may be removed, for example, by a blanket angled ion milling step. A backside etch may further be briefly performed prior to the backside base contact and collector contact formation steps to facilitate an undercut of the sidewall to avoid the situation where the base and collector contact isolation is compromised. This brief back side etch may result in an undesirable increase in extrinsic base sheet resistance. However, this may be avoided with proper design of the epitaxial structure such that the backside base etch is selective against a layer formed between the base and collector which does not otherwise significantly comprise the device performance and is of an approximate thickness equal to the material removed in the brief backside etch.

Figure 16:
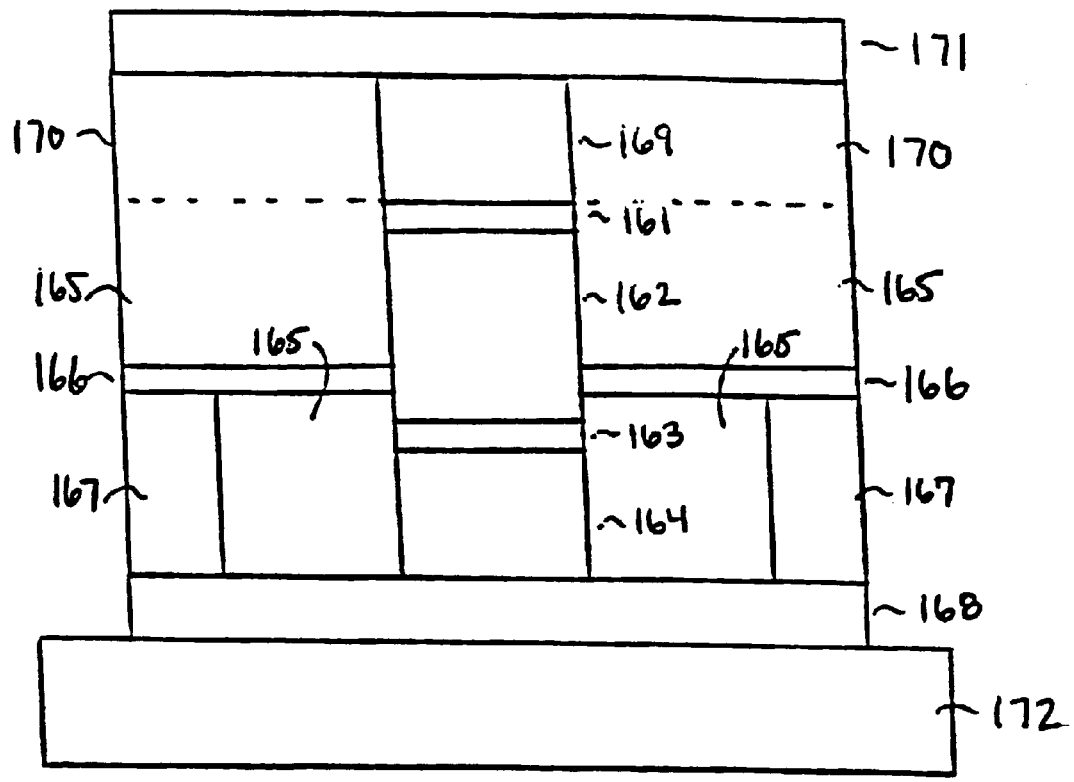
FIG. 16 is a sectional view of a static induction transistor according to the invention.

FIG. 16 is a sectional view of a static induction transistor or heterojunction field effect device according to the invention. The device includes an n+ drain region 161, and n+ source region 163 and an n− channel region 162. Gate contacts 166 are made to n− channel region 162, drain contact 169 is made is drain region 161 and source contact 164 is made to source region 163. On either side of the device are thermal spreaders or surrogate substrates 168 and 171. The thermal spreaders 168 and 171 may be made of the same materials as the surrogate substrate 41 described above. Further, they may either be attached or deposited when forming the device. The device including the thermal spreaders is bonded to heat sink 172 which could be made of diamond, AlN, BeO or Cu. The static induction transistor according to the invention has symmetrically self-aligned drain and source regions. The extrinsic drain capacitance is also virtually eliminated.

Regions 161–163 are typically formed of GaAs, SiC or GaN. Regions 161 and 163 are typically about 1000 Å in thickness and region 162 has a thickness in the range of 0.25 to 2.5 $\mu$m. The source region material may also be chosen to have a higher bandgap than n− channel region 162. The metal contacts may be formed of TiPt/Au as in the previous embodiments.

Figure 17:
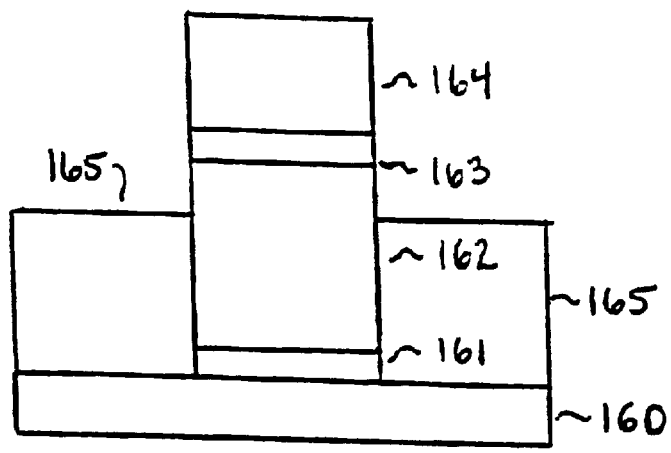
FIG. 17 is a sectional view illustrating steps used in forming the static induction transistor according to the invention.
Figure 18:
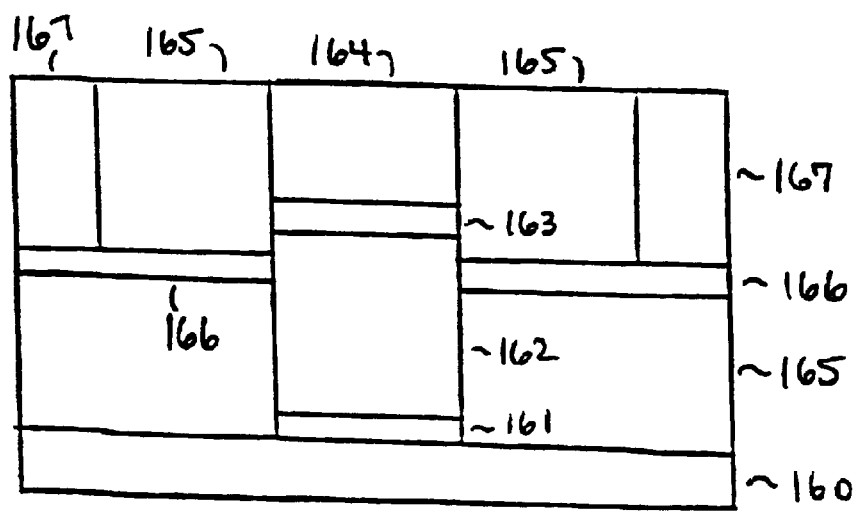
FIG. 18 is a sectional view illustrating steps used in forming the static induction transistor according to the invention.

The static induction transistor is formed using similar techniques to those described above for the HBT embodiment. First, as shown in FIG. 17, a stack of layers including an n+ source, n− channel region and n+ drain region are formed on a substrate 160. The layers may be formed by MBE or MOCVD. Source metalization 164 is formed, using known metalization and lithography processes, and is used as a mask to etch the layers to form the device regions. Removable film material 165 is deposited up to a level at which the gate contacts 166 are to be formed. Typically, gate contacts 166 are formed closer to the source than to the drain in this device. The formation of these contacts on the vertical sides may be done with the aid of a sidewall or other techniques typically used in the fabrication of SIT devices. After forming the contacts 166, contacts 167 are formed using standard techniques. More removable film material 165 is added and the device is planarized. This is illustrated in FIG. 18.

A first thermal spreader or surrogate substrate 168 is then attached to the device, allowing interconnection to metal contacts 166 and 167 and source contact 164. The device is then flipped and the substrate removed using the same techniques as described above. A drain contact 169 is formed and more removable film material 170 is added to planarize the device. A second thermal spreader or surrogate substrate 171 is then attached to be in contact with drain contact 164 and the entire device is then bonded to heat sink 172. These steps are illustrated in FIG. 16.

The present invention allows one to manufacture semiconductor devices such as HBTs with high repeatability and reproduceability. The devices are symmetric and self-aligned creating consistency in device characteristics. The devices are further self-centered which enhances the repeatability and reproduceability of the process and consistency in the device characteristics. The self-centered symmetric intrinsic process according to the invention is capable of producing manufacturable symmetric-intrinsic HBTs (SIHBTs) with $f_T$>300 GHz and $f_{max}$>1 THz and power dissipation<10 $\mu$W per transistor in the InP-based materials system. This performance is comparable or potentially superior to that obtainable with HEMT technology. This method according to the invention has the potential to produce devices exhibiting the highest possible speed, current drive, linearity, uniformity and areal density and is thus an excellent candidate for low power 100 GHz circuits.

Obviously, numerous modifications and variations of the present invention are possible in light of the above teachings. It is therefore to be understood that within the scope of the appended claims, the invention may be practiced otherwise than as specifically described herein. For example, while the invention has been described using HBTs, the present invention is not so limited. The invention is also applicable to other devices. Further, the embodiments used to illustrate HBT the invention are in the emitter-up configuration. The invention is, however, also applicable to other configurations such as emitter-down. Other conductivity type regions (i.e., p-type instead of n-type) may be used.

What is claimed as new and desired to be protected by Letters Patent is:

1. A semiconductor device, comprising:
   a first active region having a first portion with a first width and a second portion with a second width smaller than said first width;
   a second active region having a third portion with a width substantially the same as said first width and fourth portion with a width smaller than said first width;

a third active region disposed between said first and second active regions having a width substantially the same as said first width; and first, second and third contacts connected respectively to said first, second and third active regions.

2. A device as recited in claim 1, comprising:

one of said first and second active regions being self-centered with said third active region.

3. A device as recited in claim 1, wherein:

said first active region comprises an emitter;

said second active region comprises a collector;

said third active region comprises a base; and said collector is symmetrically self-aligned with said emitter.

4. A device as recited in claim 3, comprising:

one of said collector and said emitter being self-centered with said base.

5. A device as recited in claim 3, comprising:

said emitter having said second portion self-centered with said base; and said collector having said fourth portion self-centered with said base and symmetric with said second portion.

6. A device as recited in claim 3, comprising:

said base having a lower and an upper ledge; and said third contact comprising:
 a first base contact formed on said upper ledge self-aligned with said emitter; and
 a second base contact formed on said lower ledge self-aligned with said collector.

7. A device as recited in claim 3; comprising:

said base having a ledge;

said third contact formed on said ledge self-aligned with said emitter.

8. A device as recited in claim 7, wherein:

said base has ledges on opposing sides; and said third contact comprises:
 a first base contact formed from a front side of said device; and
 a second base contact formed opposing said first base contact on said ledge self-aligned with said collector and formed from a back side of said device.

9. A device as recited in claim 3, wherein:

said device is a heterojunction bipolar transistor.

10. A device as recited in claim 3, wherein:

said base layer has a lower ledge and an upper ledge; and said third contact comprises:
 a first base contact formed on said upper ledge; and
 a second base contact formed on said lower ledge.

11. A device as recited in claim 1, comprising:

said second portion disposed between said third active region and said first portion.

12. A device as recited in claim 1, comprising:

said fourth portion disposed between said third active region and said third portion.

13. A semiconductor device structure, comprising:

a first active region having a first portion with a first width and a second portion with a second width smaller than said first width;

a second active region having a third portion with a width substantially the same as said first width and fourth portion with a width smaller than said first width;

a third active region disposed between said first and second active regions having a width substantially the same as said first width; and first, second and third contacts connected respectively to said first, second and third active regions.

14. A structure as recited in claim 13, wherein:

a position of said first active region in said structure is self-centered with a position of said third active region; and a position of said second active region in said structure is self-centered with a position of said third region.

15. A structure as recited in claim 13, comprising:

said first, second and third active regions formed in a vertical stack;

said stack having a vertical axis passing through a center of said first, second and third active regions; and said first, second and third active regions each being symmetric about said vertical axis.

16. A structure as recited in claim 15, wherein:

said first and second contacts being symmetric about said vertical axis.

17. A structure as recited in claim 16, comprising:

said third contact being symmetric about said vertical axis.

18. A structure as recited in claim 13, comprising:

said third active region having a ledge; and said third contact disposed on said ledge.

19. A structure as recited in claim 13, comprising:

said third active region having ledges on opposing surfaces; and said third contact disposed on each of said ledges.

20. A structure as recited in claim 13, comprising:

said third active region having a side surface and a plane surface; and said third contact disposed on said side and plane surfaces.

21. A structure as recited in claim 13, comprising:

said third active region having a side surface and two opposing plane surfaces; and said third contact disposed on each of said side and said opposing plane surfaces.

22. A structure as recited in claim 13, comprising:

said first active region having a width substantially equal to a width of said first contact; and said second active region having a width substantially equal to a width of said second contact.

23. A structure as recited in claim 13, wherein:

said first active region comprises an emitter region;

said second active region comprises a collector region; and said third active region comprises a base region.

24. A structure as recited in claim 23, wherein:

a position of said emitter region in said structure is self-centered with a position of said base region; and a position of said collector region in said structure is self-centered with a position of said base region.

25. A structure as recited in claim 23, comprising:

said emitter, base and collector regions formed in a vertical stack;

said stack having a vertical axis passing through a center of said emitter, base, and collector regions; and said emitter, base, and collector regions each being symmetric about said vertical axis.

26. A structure as recited in claim 25, wherein:

said first and second contacts being symmetric about said vertical axis.

27. A structure as recited in claim 25, comprising:

said third contact being symmetric about said vertical axis.

28. A structure as recited in claim 23, comprising:

said base region having a ledge; and said third contact disposed on said ledge.

29. A structure as recited in claim 23, comprising:

said base region having ledges on opposing surfaces; and said third contact disposed on each of said ledges.

30. A structure as recited in claim 23, comprising:

said base region having a side surface and a plane surface; and said third contact disposed on said side and plane surfaces.

31. A structure as recited in claim 13, comprising:

said base region having a side surface and two opposing plane surfaces; and said third contact disposed on each of said side and said opposing plane surfaces.

32. A structure as recited in claim 23, comprising:

said emitter region having a width substantially equal to a width of said first contact; and said collector region having a width substantially equal to a width of said second contact.

33. A device as recited in claim 1, comprising:

said first and second active regions being symmetrically self-aligned.

34. A device as recited in claim 1, comprising:

said third contact formed on said third active region interior to an outer edge of third active region.

35. A structure as recited in claim 13, comprising:

a position of said first active region being self-centered with a position of said second active region in said device structure.

36. A structure as recited in claim 13, comprising:

said third contact formed on said third active region interior to an outer edge of third active region.

* * * * *